(12) United States Patent
Lee

(10) Patent No.: US 8,067,823 B2
(45) Date of Patent: Nov. 29, 2011

(54) CHIP SCALE PACKAGE HAVING FLIP CHIP INTERCONNECT ON DIE PADDLE

(75) Inventor: Cheonhee Lee, Cheong-ju (KR)

(73) Assignee: STATS ChipPAC, Ltd., Singapore (SG)

( * ) Notice: Subject to any disclaimer, the term of this patent is extended or adjusted under 35 U.S.C. 154(b) by 1059 days.

(21) Appl. No.: 11/280,971

(22) Filed: Nov. 15, 2005

(65) Prior Publication Data

US 2006/0192294 A1    Aug. 31, 2006

Related U.S. Application Data

(60) Provisional application No. 60/628,525, filed on Nov. 15, 2004.

(51) Int. Cl.
*H01L 23/495* (2006.01)

(52) U.S. Cl. .......... 257/673; 257/E21.519; 257/666; 438/123

(58) Field of Classification Search .......... 257/666, 257/686, 778, E21.514, E21.511, E21.519, 257/E23.039, E23.046, E23.052, 670, 671, 257/673, 687, 788, 796; 438/123, 124
See application file for complete search history.

(56) References Cited

U.S. PATENT DOCUMENTS

| | | | | |
|---|---|---|---|---|
| 4,005,472 A | * | 1/1977 | Harris et al. | 257/737 |
| 4,122,215 A | * | 10/1978 | Vratny | 438/614 |
| 4,707,724 A | * | 11/1987 | Suzuki et al. | 257/677 |
| 5,414,299 A | * | 5/1995 | Wang et al. | 257/702 |
| 5,811,877 A | * | 9/1998 | Miyano et al. | 257/706 |
| 6,028,011 A | * | 2/2000 | Takase et al. | 438/745 |
| 6,083,645 A | | 7/2000 | Takeuchi | |
| 6,593,545 B1 | * | 7/2003 | Greenwood et al. | 219/121.85 |
| 6,597,059 B1 | * | 7/2003 | McCann et al. | 257/673 |
| 6,927,478 B2 | * | 8/2005 | Paek | 257/666 |
| 6,953,988 B2 | * | 10/2005 | Seo et al. | 257/666 |
| 7,045,882 B2 | | 5/2006 | Paek | |
| 7,045,883 B1 | | 5/2006 | McCann et al. | |
| 7,064,009 B1 | | 6/2006 | McCann et al. | |
| 7,112,871 B2 | | 9/2006 | Shiu et al. | |
| 2002/0020907 A1 | * | 2/2002 | Seo et al. | 257/687 |
| 2003/0001252 A1 | * | 1/2003 | Ku et al. | 257/686 |
| 2006/0214308 A1 | | 9/2006 | Yu et al. | |

* cited by examiner

*Primary Examiner* — Chris Chu

(74) *Attorney, Agent, or Firm* — Robert D. Atkins; Patent Law Group

(57) ABSTRACT

A flip chip lead frame package includes a die and a lead frame having a die paddle and leads, and has interconnection between the active site of the die and the die paddle. Also, methods for making the package are disclosed.

18 Claims, 2 Drawing Sheets

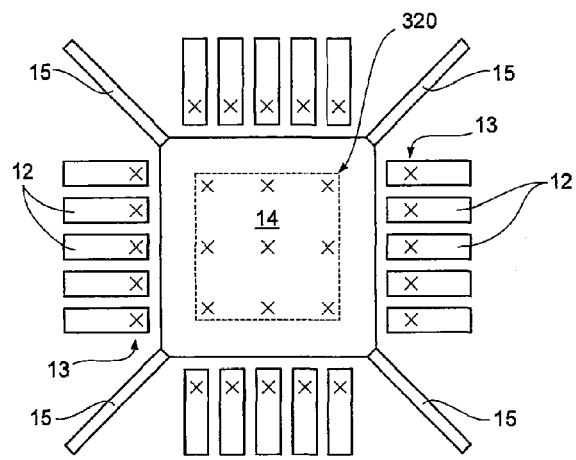
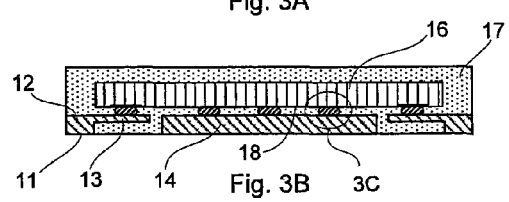
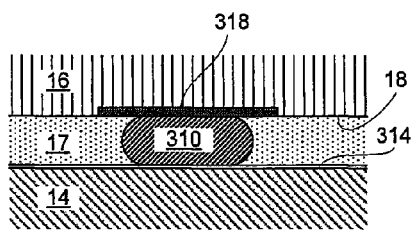
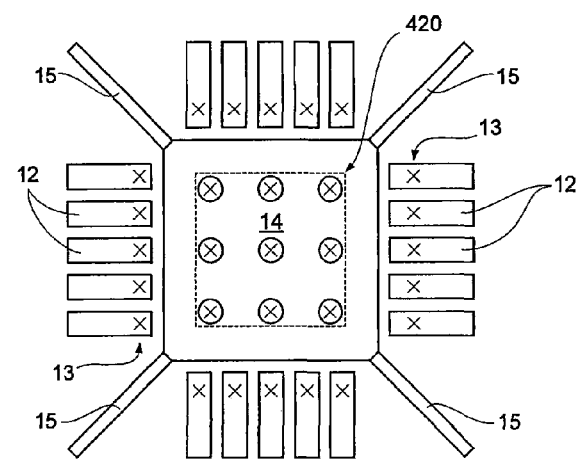
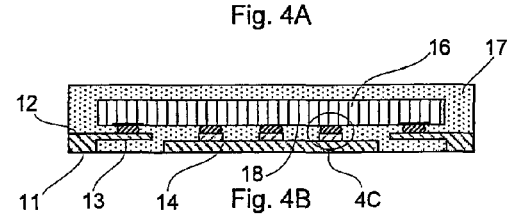
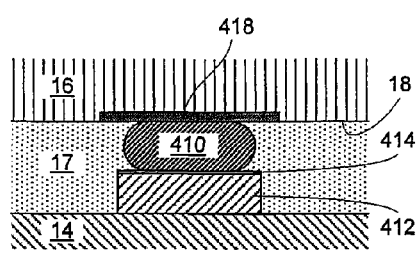

CHIP SCALE PACKAGE HAVING FLIP CHIP INTERCONNECT ON DIE PADDLE

CROSS REFERENCE TO RELATED APPLICATION

This application claims the benefit of U.S. Provisional Application No. 60/628,525, filed Nov. 15, 2004, titled "Flip-chip-QFN integrated circuit system", which is hereby incorporated by reference.

BACKGROUND

This invention relates to semiconductor packaging and, particularly, to lead frame packaging such as QFN ("Quad Flat No-lead") packaging.

A conventional QFN lead frame package includes a lead frame consisting of a centrally situated die paddle and peripheral leads, and a die attached to, and electrically connected with, the lead frame; and a molding or in capsulation that seals all of the parts of the die-and-lead frame assembly, and leaves land portions of the leads exposed for second-level interconnection of the package to circuitry in the environment of use, such as circuitry on a printed circuit board.

The die in a lead frame package may be affixed to the lead frame by attaching the backside of the die to the die paddle using a die attach adhesive; and in such an arrangement, where the active side of the die faces away from the lead frame (that is, the active site of the die faces "upward"), electrical interconnection of the die with the lead frame can be made by way of wire bonds between interconnect pads on the die and bond sites on the leads.

Or, the die in a lead frame package may be a so-called flip chip die, which is situated in the package with the active side toward the lead frame, and he is attached and electrically connected to the leads by flip chip interconnections between peripheral pads on the die and bond sites on the leads. In a flip chip lead frame package of this type, there is no direct mechanical or electrical connection between the die and the die paddle.

In a conventional flip chip QFN lead frame package, therefore, electrical connections between the die and the lead frame are made only by way of connection of peripheral die pads with the leads. In many die, interconnect pads are situated in a central portion of the die, and particularly die pads for power and ground interconnection may be situated in a center portion of the die. Such die cannot be mounted in a conventional flip chip QFN package, and some proportion of the peripheral die pads must be dedicated to ground or power connection.

Also, in a conventional flip chip QFN package, the active side of the die is separated from the die paddle and, accordingly, if heat generated at the active site of the die is to pass out of the package by way of the die paddle, the heat must pass through a layer of encapsulation or molding between the die and the die paddle.

SUMMARY

This invention is directed to, and in one general aspect the invention features, a flip chip lead frame package having interconnection between the active site of the die and the die paddle.

According to one general aspect of the invention, a lead frame is provided, which includes a centrally situated die paddle and peripherally arranged leads, the leads being separated from the die paddle; a die is mounted in a flip chip arrangement on the lead frame, by flip chip interconnection between peripheral pads on the active side of the die and bond sites on the leads, and by flip chip interconnection between at least one die pad and a corresponding site on the die paddle.

In some embodiments, the flip chip interconnect of the die with the leads is of the same type as the flip chip interconnection of the die with the die paddle. In such embodiments, the peripheral interconnections to the leads and the interconnections to the die paddle can be made in one and the same interconnect operation.

In some embodiments, the flip chip interconnection includes a solder bond. In some such embodiments, bumps formed on pads on the die are bonded to bonding sites on the lead frame (die paddle and leads) by reflow of solder contacting a portion of the bumps and a portion of the bonding sites on the lead frame. The bumps may in some embodiments be formed of gold, and in preferred such embodiments the bonds are gold stud bumps.

In some embodiments, the flip chip interconnection includes a thermo-mechanical ("solid state") bond. In some such embodiments, bumps formed on pads on the die are bonded to bonding sites on the lead frame (die paddle and leads) by contacting the bumps with the bonding sites, pressing the bumps and the bonding sites against one another, and applying heat to raise the temperature of the bumps and/or the bonding sites to a temperature and pressure sufficient to form a thermo-mechanical bond. The bumps may in some embodiments be formed of gold or may be formed of a metal plated with gold, and in preferred such embodiments the bumps are gold stud bumps. In some embodiments the lead frame is copper, and it may be plated with one or more thin layers including nickel or tin or silver, or a combination of, for example, nickel and palladium or tin and palladium. In preferred embodiments where the bumps contact the bond sites, a surface of the bumps comprises gold and a surface of the bond sites comprises tin.

In some embodiments, the flip chip interconnection between the die in the die paddle includes a thermo-mechanical bond to an island structure on the die paddle. In some such embodiments, the island structure is formed by patterned etching.

In another general aspect, the invention features a package comprising a lead frame having a die mounted in flip chip arrangement thereon, by flip chip interconnection between peripheral pads on the active side of the die and bond sites on the leads, and by flip chip interconnection between at least one die pad and a corresponding site on the die paddle.

In another general aspect, the invention features methods for making a package comprising a lead frame having a die mounted in flip chip arrangement thereon, by providing a lead frame having a first side and a second side, and including a die paddle and leads, and providing a semiconductor die having peripheral pads and at least one additional pad on an active side thereof, and forming flip chip interconnection between peripheral pads on the active side of the die and bond sites on the leads, and by flip chip interconnection between at least one die pad and a corresponding site on the die paddle.

In some aspects the flip chip interconnection is formed by a solder reflow; in some aspects of flip chip interconnection is formed by solid-state (thermo-mechanical) bonding.

BRIEF DESCRIPTION OF THE DRAWINGS

FIG. 3A is a diagrammatic sketch in a plan view showing a lead frame as employed in a second embodiment of the invention.

FIG. 3B is a diagrammatic sketch in a sectional view through a flip chip package according to a second embodiment of the invention.

FIG. 3C is a diagrammatic sketch in a sectional view through a flip chip package according to a second embodiment of the invention, as at 3C in FIG. 3B.

FIG. 4A is a diagrammatic sketch in a plan view showing a lead frame as employed in third embodiment of the invention.

FIG. 4B is a diagrammatic sketch in a sectional view through a flip chip package according to a third embodiment of the invention.

FIG. 4C is a diagrammatic sketch in a sectional view through a flip chip package according to a third embodiment of the invention, as at 4C in FIG. 4B.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the FIGs. illustrating embodiments of the invention, elements corresponding to elements shown in other drawings are not all particularly renumbered, although they are all readily identifiable in all the FIGs.

Figure 1A:
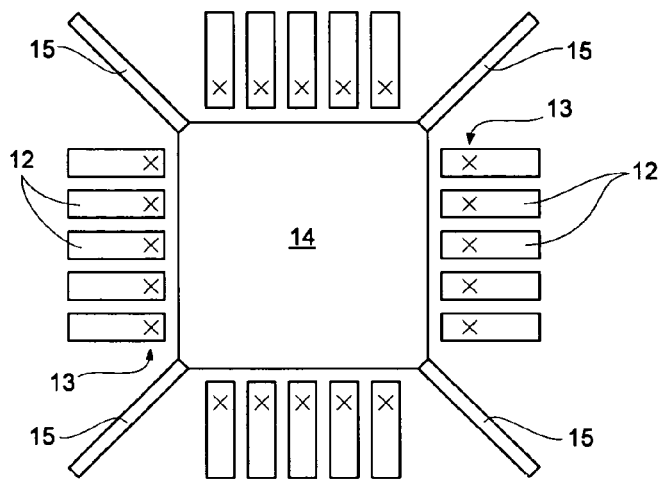
FIG. 1A is a diagrammatic sketch in a plan view showing a conventional lead frame.

Turning now to FIG. 1A, a conventional lead frame is shown in a diagrammatic plan view. The lead frame includes a central rectangular (for example, square) die paddle 14 having the remnants of tie bars 15 attached at the corners, and peripheral leads each including an outer lead portion 12 and an inner lead portion 13. The lead frame has a die attach surface (here referred to as the "upper" surface), on which the die is attached into which the die is electrically connected, and an opposite surface (here referred to as the "lower" surface), at which interconnection is made with underlying circuitry such as a printed circuit board. As shown in this example, the leads are arranged in rows, one row along each edge of the die paddle, with the inner lead portions separated from the die paddle by a space. Such a conventional lead frame is suitable for use with either a wire bonded die or a flip chip die. In a package using a wire bonded die, the die is affixed using a die attach adhesive onto a die attach area of the die paddle, with the active side of the die facing away from the die paddle. Interconnect pads on the die (not shown in this figure) are connected by wires to bond sites (shown at X on each lead in the figure) on the inner portions 13 of the leads. Where a flip chip die is used, the die is positioned with the active side of the die facing toward the die paddle, and with interconnect pads on the die aligned with bond sites on the inner portions 13 of the respective leads.

Figure 1B:
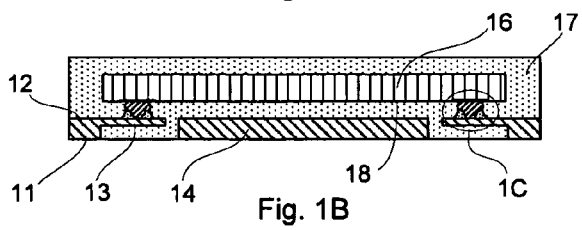
FIG. 1B is a diagrammatic sketch in a sectional view through a conventional flip chip QFN package.

FIG. 1B is a sectional view showing a conventional flip chip QFN package. The package includes a lead frame, including a die paddle 14, and leads having inner lead portions 13 and outer lead portions 12. Flip chip interconnects, for example 1C, which may be bumps or balls, are mounted on die pads 118 peripherally arranged in the active surface 18 of the die. The die is aligned over the lead frame, with the active side 18 of the die facing toward the die attach side of the lead frame, and is affixed to and electrically interconnected with the lead frame by bonding the flip chip interconnects onto the bond sites on the inner portions 13 of the respective leads 12. In the conventional flip chip QFN package, as shown for example in FIG. 1B, there is no connection between the die 16 and the die attach side of the die paddle. All the features of the package are enclosed by an encapsulant or molding 17 (formed by press molding or by liquid encapsulation) to seal and protect the die, the interconnections, and the lead frame; the lower surface of the lead frame, including the lower surface of the die paddle 14 and lands 11 on the lower surface of the outer lead portions 12 are left uncovered by the encapsulant or molding, so that they are exposed on the lower surface of the package. Electrical connection of the package to underlying circuitry such as, for example, a printed circuit board (not shown in the figures) is made by way of the lands 11. The die paddle in the conventional package is not connected electrically with the die or with the leads.

Figure 1C:
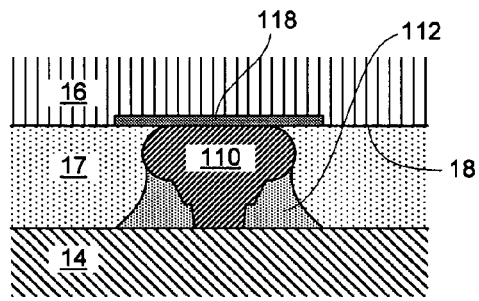
FIG. 1C is a diagrammatic sketch in a sectional view through a conventional flip chip QFN package, as at 1C in FIG. 1B.

One type of flip chip interconnection is shown by way of example in FIG. 1C. A gold (Au) bump 110 is formed on a die pad 118 in the active surface 18 of the die 16, typically in a so-called "stud bump" operation employing wire bond tools. The die is attached to and electrically connected to die to bond sites on the leads 14 by solder joint. A small quantity of a solder composition is disposed (for example in a dipping operation) onto parts of the bumps which will contact the surface of the leads; or is disposed onto target spots on the leads (for example by deposition through a pattern screen, or using a dispenser), and the connection is made by bringing the parts into contact and reflowing the solder, as shown for example at 112. The interconnection is mechanically stabilized by the encapsulant or molding 17.

According to the invention, at least one site, and usually several sites, on a central portion of the active side of the die are connected in various embodiments to the die attach side of the die paddle. Three embodiments are described, with variations, and other embodiments are within the claims.

Figure 2A:
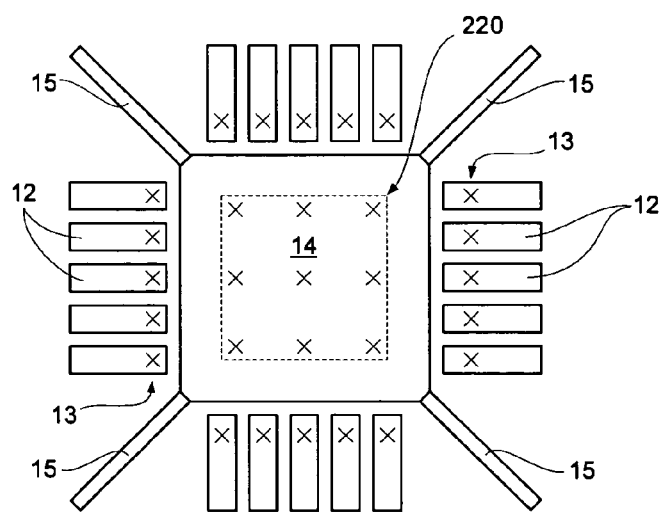
FIG. 2A is a diagrammatic sketch in a plan view showing a lead frame as employed in one embodiment of the invention.
Figure 2B:
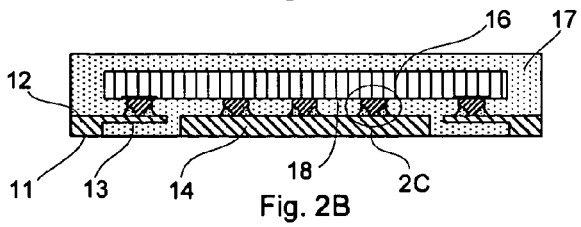
FIG. 2B is a diagrammatic sketch in a sectional view through a flip chip package according to an embodiment of the invention.
Figure 2C:
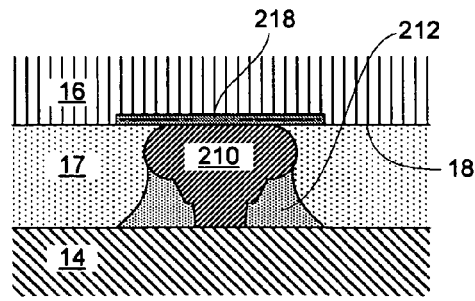
FIG. 2C is a diagrammatic sketch in a sectional view through a flip chip package according to an embodiment of the invention, as at 2C in FIG. 2B.

In a first embodiment of to the invention, illustrated in FIGS. 2A, 2B and 2C, electrical interconnection between the die pads and bond sites on the respective leads is made using a solder joint, generally as described above with reference to a conventional flip chip QFN package. In addition, at least one connection is made (and usually more: nine in the example shown in figures), using a similar solder joint, between bond pads located in an area near the center of the active side of the die and attachment sites on the die attach side of the die paddle. In the package according to this embodiment, a conventional lead frame can be used, as shown in FIG. 1A. The sectional view in FIG. 2B shows, in addition to the features illustrated in FIG. 1B, the die paddle interconnects, for example 2C, between the central area of the active site of the die and the die paddle. Just by way of example, FIG. 2A shows an array 220 of sites on the die paddle (shown by Xs in the figure), corresponding to an array of die paddle interconnects in a central area of the active site of the die, of which a row of three are shown in the sectional view in FIG. 2B. As noted above, and as illustrated in FIG. 2C, the die paddle interconnects 2C are similar to the interconnects between the peripheral die pads and the leads. Particularly, a bump 210 is attached to a die pad 218, for example by using a stud bump operation, and the die paddle interconnections are made by solder reflow, as shown at 212, in the same reflow step by which the peripheral interconnects to the leads are made.

In a second embodiment of the invention, illustrated in FIGS. 3A, 3B and 3C, electrical interconnection between the die pads and bond sites on the respective leads is made a thermo-compression bond between a bump on the die and a plated surface of the lead. In addition, at least one connection is made (and usually more: nine in the example shown in figures), using a similar thermo-compression bond, between bumps on bond pads located in an area near the center of the active side of the die and plated attachment sites on the die attach side of the die paddle. In the package according to this embodiment, a conventional lead frame can be used, as shown in FIG. 3A, with the addition of the plating on the die attach surfaces of at least the bond sites on the leads and on the die paddle. The sectional view in FIG. 3B shows, in addition to the features illustrated in FIG. 1B, the die paddle interconnects, for example 3C, between the central area of the active site of the die and the die paddle. Just by way of example, FIG. 3A shows an array 320 of sites on the die paddle (shown by Xs in the figure), corresponding to an array of die paddle interconnects in a central area of the active site of the die, of which a row of three are shown in the sectional view in FIG. 3B. The die paddle interconnects 3C are similar to the interconnects between the peripheral die pads and the leads in this embodiment. Particularly, a bump 310 is attached to die pads 318, both in the periphery of the die and near the center of the die, for example by using a stud bump operation, and the die paddle interconnections are made by the compression bonding to the plated target surfaces 314 in the same thermo-compression bonding step by which the peripheral interconnects to the leads are made.

A thermo-compression bond in this aspect of the invention is formed by contacting a bump on the die pad with an interconnect site on the lead frame (die paddle or lead), pressing the bump and the site on the lead frame against one another, and heating the bump and/or of the site on the lead frame to a temperature sufficiently high to formal metallurgical connection between the bump and the interconnect site, without melting the bump. Preferably, the material of the bump is gold (Au); and the material at the interconnect site on the lead frame includes tin. In some embodiments, the bump is gold plated, such as for example copper (Cu) plated with Au or nickel/gold (Ni/Au) or electroless Ni/Au. In some embodiments, the lead frame is copper, and the plating includes tin or nickel or tin or silver, or a combination of, for example, nickel and palladium (Ni/Pd) or Sn/Pd. Some techniques for forming thermo-compression bonds between bumps on peripheral die pads and interconnect sites in a substrate are described for example in U.S. Pat. No. 6,737,295, which is hereby incorporated by reference.

In a third embodiment of the invention, illustrated in FIGS. 4A, 4B and 4C, electrical interconnection between the die pads and bond sites on the respective leads is made as in the embodiment of FIGS. 3A, 3B and 3C by a thermo-compression bond between a bump on the die and a plated surface of the lead. In addition, at least one connection is made (and usually more: nine in the example shown in figures), using a similar thermo-compression bond, between bumps on bond pads located in an area near the center of the active side of the die and plated attachment sites on islands in the die attach side of the die paddle. In the package according to this embodiment, the die paddle is modified to form the islands, and a conventional lead frame can be modified, for example by patterned etching, to provide the island structure, as shown in FIGS. 4A, 4B, and 4C. Preferably the modified lead frame also has a plating on the die attach surfaces of at least the bond sites on the leads and the attachment sites on the islands. The sectional view in FIG. 4B shows, in addition to the features illustrated in FIG. 3B, the islands and die paddle interconnects, for example 4C, between the central area of the active site of the die and the die paddle. Just by way of example, FIG. 4A shows an array 420 of islands on the die paddle having sites (shown by Xs in the figure), corresponding to an array of die paddle interconnects in a central area of the active site of the die, of which a row of three are shown in the sectional view in FIG. 4B. The die paddle interconnects 4C are similar to the interconnects between the peripheral die pads and the leads in this embodiment. Particularly, a bump 410 is attached to die pads 418, both in the periphery of the die and near the center of the die, for example by using a stud bump operation, and the die paddle interconnections are made by the compression bonding to the plated target surfaces 414 on the islands 412 in the same thermo-compression bonding step by which the peripheral interconnects to the leads are made.

An embodiment as in FIGS. 4A, 4B and 4C can provide improved adhesion between the encapsulation or molding and the die paddle, thereby improving the stability of the package under stress. Although the islands are shown in a uniform array, and are shown having uniform size and (circular) shape, as may be appreciated, the islands may have any of a variety of shapes and may be arranged in any other matter, so long as they present good bond sites at a uniform level (good z-uniformity) and are suitably aligned with the bumps on the die (good x-y position).

The interconnections between the die and the die paddle according to the invention can provide for conduction of electrical signals or for improved conduction of heat between the die and the paddle, and thereby to the underlying structure to which the package is attached in use. For example, although the die paddle is ordinarily a unitary piece, and therefore as a practical matter is useful only as a source of power or, more likely, as a ground, it is possible according to the invention to design the circuitry on the die so that, for example, ground pads are preferentially situated near the center of the die, and, accordingly, many or all of the ground interconnections to the underlying circuitry can be made by way of the die paddle. And, for example, the interconnections between the die in the die paddle can provide a direct conduit for heat from the active site of the die to the die paddle, and can provide for heat conduction to a sink or for heat radiation to a void in the environment of the package in use.

Other embodiments are within the following claims. For example, the molding or encapsulation need not necessarily cover the backside surface of the die, and the backside of the die can be left exposed to the environment of the package in use. And, for example, the land surfaces of the leads need not necessarily be coplanar with the lower surface of the die paddle; particularly, for example, the lower surface of the die paddle may be formed in a plane upward from the land surfaces of the leads, and the molding or encapsulation may cover the lower surface of the die paddle. Also, where it is not required that each connection between the die and the die paddle provide electrical continuity, but instead at least one connection between the die and the die paddle provides only thermal conduction, the interconnection may be interrupted by an insulator, for example by mounting the interconnect structure on a nonelectrically conductive part of the die, such as a passivation area.

What is claimed is:

1. A flip chip lead frame package, comprising:
a die paddle having an array of interconnect sites disposed in a central area of the die paddle, the array of interconnect sites formed as islands by patterned etching;
a plurality of leads disposed on each side apart from the die paddle; and
a semiconductor die having an active surface disposed on the die paddle with the active surface facing the die paddle, the semiconductor die electrically connected to the plurality of leads, the semiconductor die further electrically connected to the array of interconnect sites on the die paddle with thermo-compression bonds by pressing bumps formed on the active surface of the semiconductor die against the array of interconnect sites on the die paddle and heating the bumps and interconnect sites to a temperature to form a metallurgical connection without melting the bumps, wherein the thermo-compression bonds provide heat transfer from the semiconductor die to the die paddle.

2. The flip chip lead frame package of claim 1, wherein the bumps on the semiconductor die are made with gold.

3. The flip chip lead frame package of claim 1, wherein the bumps on the semiconductor die are copper plated with gold or nickel.

4. The flip chip lead frame package of claim 1, wherein the bumps on the semiconductor die are electroless nickel and gold.

5. The flip chip lead frame package of claim 1, wherein the array of interconnect sites are made with tin.

6. The flip chip lead frame package of claim 1, wherein the lead frame is made with copper and plated with a metal selected from the group consisting of tin, nickel, silver, and palladium.

7. A semiconductor package, comprising:
a leadframe including,
(a) a die paddle having an array of interconnect sites disposed in a central area of the die paddle, the array of interconnect sites formed as islands by patterned etching, and
(b) a plurality of leads disposed on each side apart from the die paddle; and
a semiconductor die having an active surface disposed on the die paddle, the semiconductor die electrically connected to the plurality of leads, the semiconductor die further electrically connected to the array of interconnect sites on the die paddle with thermo-compression bonds by pressing bumps formed on the active surface of the semiconductor die against the array of interconnect sites on the die paddle and heating the bumps and interconnect sites to a temperature to form a metallurgical connection without melting the bumps.

8. The semiconductor package of claim 7, wherein the thermo-compression bonds provide heat transfer from the semiconductor die to the die paddle.

9. The semiconductor package of claim 7, wherein the bumps on the semiconductor die are copper plated with gold or nickel.

10. The semiconductor package of claim 7, wherein the bumps on the semiconductor die are electroless nickel and gold.

11. The semiconductor package of claim 7, wherein the array of interconnect sites are made with tin.

12. The semiconductor package of claim 7, wherein the lead frame is made with copper and plated with a metal selected from the group consisting of tin, nickel, silver, and palladium.

13. A semiconductor package, comprising:
a leadframe including,
(a) a die paddle having an array of interconnect sites disposed in a central area of the die paddle, the array of interconnect sites formed as islands by patterned etching, and
(b) a plurality of leads disposed on each side apart from the die paddle; and
a semiconductor die having an active surface disposed on the die paddle, the semiconductor die electrically connected to the plurality of leads, the semiconductor die further electrically connected to the array of interconnect sites on the die paddle with thermo-compression bonds which provide heat transfer from the semiconductor die to the die paddle.

14. The semiconductor package of claim 13, wherein the thermo-compression bonds are formed by pressing bumps on the active surface of the semiconductor die against the array of interconnect sites on the die paddle and heating the bumps and interconnect sites to a temperature to form a metallurgical connection without melting the bumps.

15. The semiconductor package of claim 13, wherein the bumps on the semiconductor die are copper plated with gold or nickel.

16. The semiconductor package of claim 13, wherein the bumps on the semiconductor die are electroless nickel and gold.

17. The semiconductor package of claim 13, wherein the array of interconnect sites are made with tin.

18. The semiconductor package of claim 13, wherein the lead frame is made with copper and plated with a metal selected from the group consisting of tin, nickel, silver, and palladium.

* * * * *